United States Patent [19]
Vorenkamp et al.

[11] Patent Number: 5,835,047
[45] Date of Patent: Nov. 10, 1998

[54] FOLDING A/D CONVERTER

[75] Inventors: Pieter Vorenkamp; Rudy J. Van De Plassche, both of Eindhoven, Netherlands

[73] Assignee: U.S. Philips Corporation, New York, N.Y.

[21] Appl. No.: 704,198

[22] Filed: Aug. 28, 1996

[30] Foreign Application Priority Data

Aug. 31, 1995 [EP] European Pat. Off. ............ 95202355

[51] Int. Cl.⁶ .................................................. H03M 1/36
[52] U.S. Cl. ........................................ 341/156; 341/155
[58] Field of Search .................................. 341/159, 118, 341/158, 160

[56] References Cited

U.S. PATENT DOCUMENTS 5,157,397  10/1992  Vernon ................................ 341/157
5,329,279   7/1994  Barbu et al. ......................... 341/50

OTHER PUBLICATIONS

"An 8–bit Video ADC Incorporating Folding and Interpolation Techniques", by R.E.J. van de Grift et al, IEEE Journal of Solid–State Circuits, vol. SC–22, No. 6, Dec. 1987, pp. 944–953.

*Primary Examiner*—Brian K. Young
*Attorney, Agent, or Firm*—Steven R. Biren

[57] ABSTRACT

In a folding A/D converter, a comparison part CPM provides a plurality of comparison signals $Sc1 \ldots Sc9$ in response to an input signal Si. The transients in the comparison signals $Sc1 \ldots Sc9$ are mutually shifted and substantially overlap. Because of the overlap, only a relatively small input signal variation is needed to pass all the transients. A limiting part LIM effectively selects portions of the transients. A combining part CBM effectively multiplexes these selected portions into a folding signal Sf. The selection by the limiting part LIM prevents distortion of the folding signal Sf, despite the overlap.

8 Claims, 10 Drawing Sheets

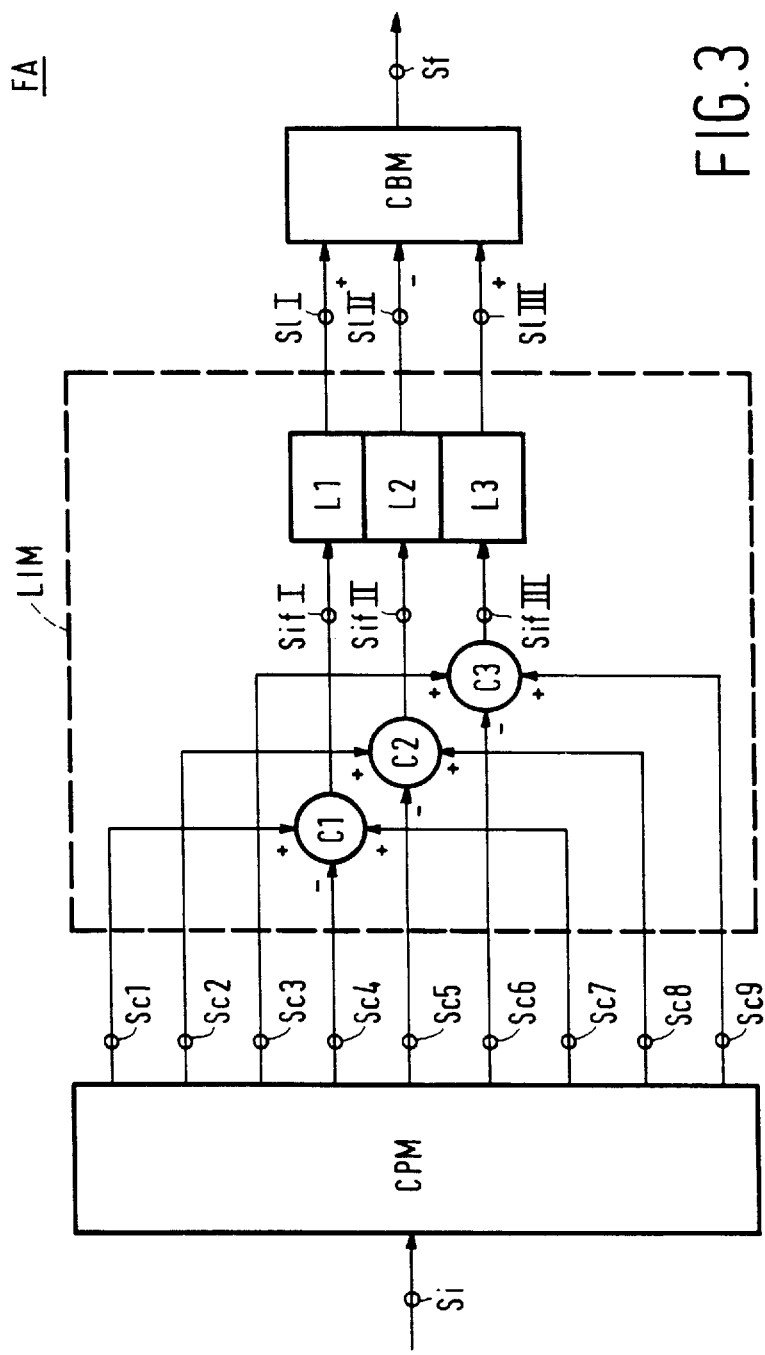

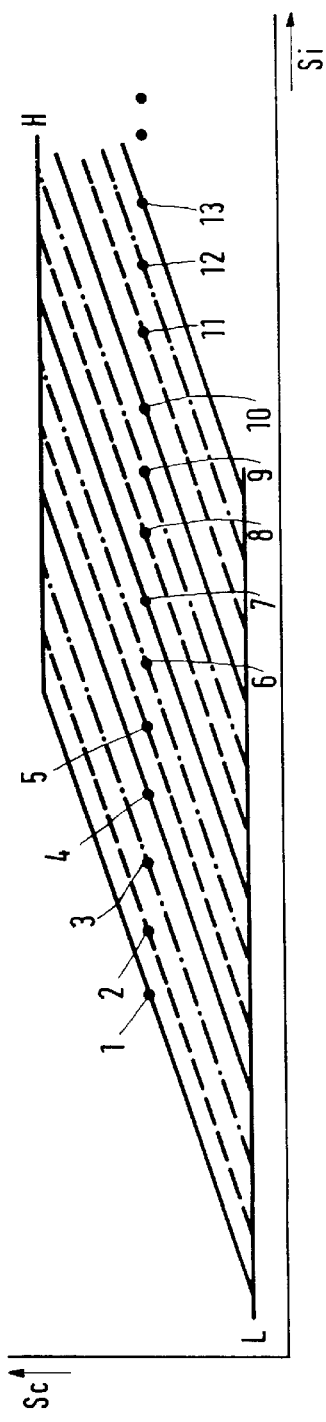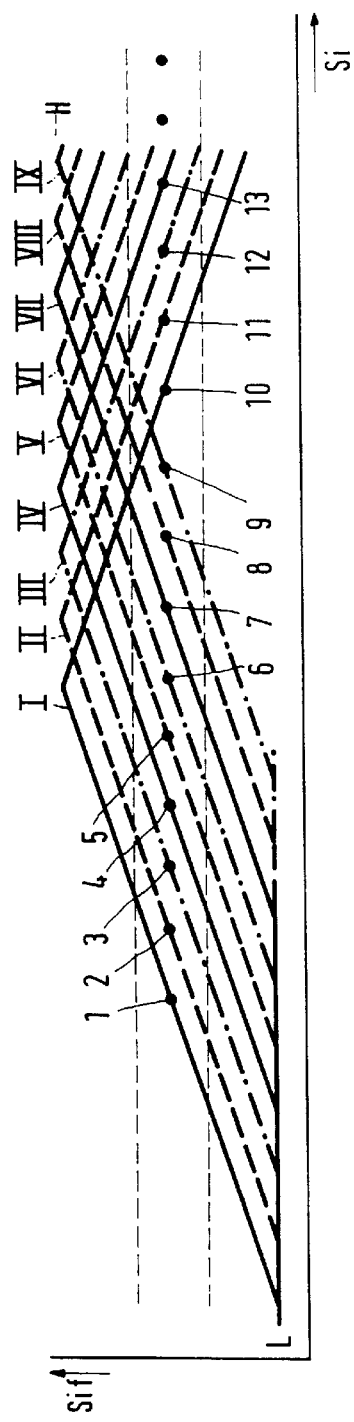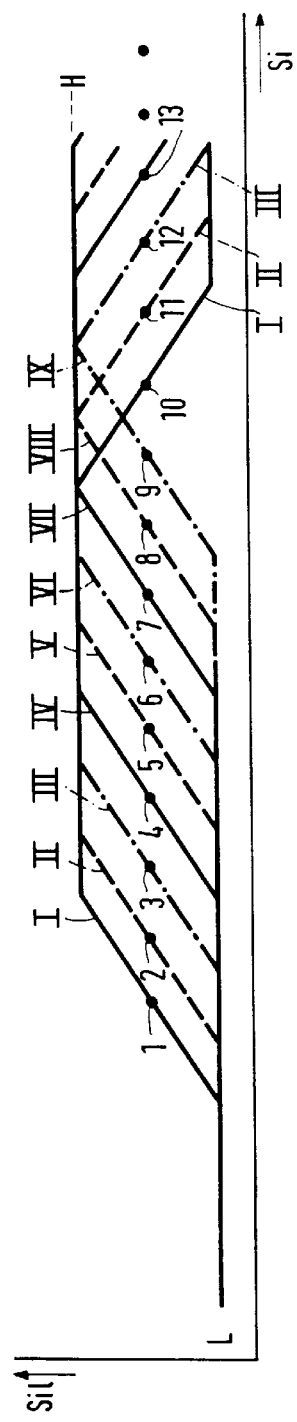

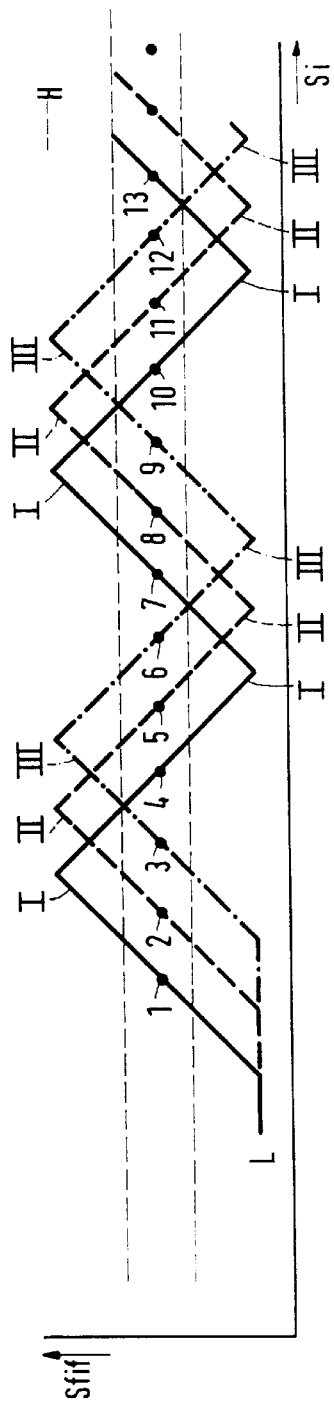
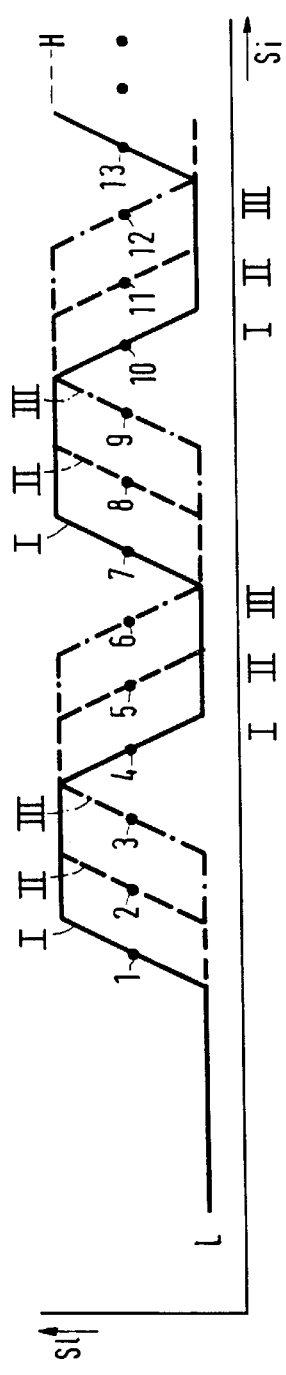
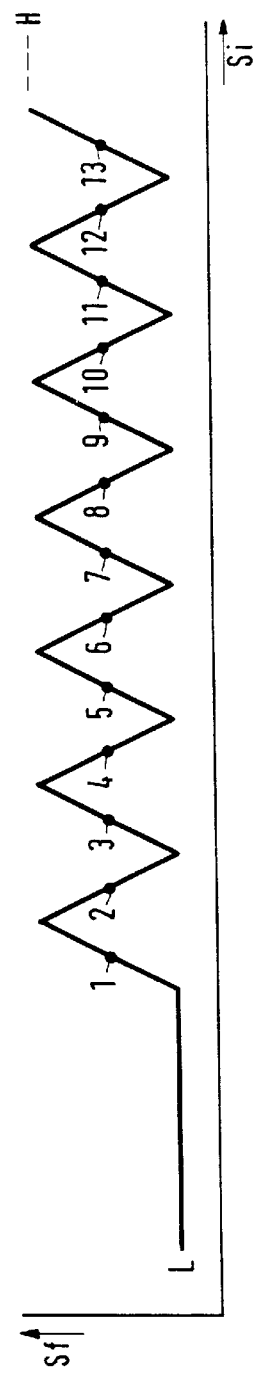

FOLDING A/D CONVERTER

BACKGROUND OF THE INVENTION

1. Field of the Invention

The invention relates to an analog-to-digital converter (A/D converter) having a folding amplifier. Such an A/D converter, which is also referred to as folding A/D converter, is particularly suitable for use in consumer products. In a television set, for example, a folding A/D converter can be used to digitize video signals.

The invention further relates to a receiver incorporating such an A/D converter, and to a folding amplifier as such.

2. Description of the Related Art

The article "An 8-bit Video ADC Incorporating Folding and Interpolation Techniques" by Rob E. J. van de Grift et al., published in IEEE Journal of Solid-State Circuits, Vol. SC-22, No. 6, December 1987, pp. 944–953, describes a folding A/D converter. A block diagram of the folding A/D converter is shown in FIG. 5 of the cited article.

In the known folding A/D converter, an analog input signal Vin is supplied to four folding amplifiers A1 . . . A4 which provide, in response, four respective folding signals. FIG. 3 of the cited article illustrates that these folding signals are sinewave-like when the input signal Vin increases linearly. In each sinewave-like folding signal, there are 16 transients—or zero crossings—between two states, say, a "high" state (H) and a "low" state (L).

Sixteen latch input signals are derived from the four folding signals by means of interpolation. An array of 16 latches decides on the state, "high" (H) or "low" (L), of the respective 16 latch input signals. Each latch provides a logic ONE or ZERO in accordance with its decision. The output code of the latches is transformed into an 8-bit binary code. This is effected by means of a cycle pointer and an encoder, both shown in FIG. 5 of the cited article. Latched output buffers supply the 8-bit binary code at the output of the A/D converter.

The constitution of a folding amplifier is illustrated in FIG. 10 of the cited article. The folding amplifier can be divided into two functional parts: a comparison part and a combining part. The comparison part comprises 16 differential transistor pairs which commonly receive the input signal Vin. Each differential pair further receives a different reference voltage Va, Vb, Vc, etc. The difference between two adjacent reference voltages, for example, Vb–Va, is constant and is referred to as tap voltage Vtap. In the A/D converter described in the cited article, the tap voltage Vtap is 130 mV.

The comparison part in FIG. 10 provides 16 comparison signals in response to the input signal Vin. These 16 comparison signals are in the form of balanced differential pair currents Ia1–Ia2, Ib1–Ib2, Ic1–Ic2, etc. The comparison signals are illustrated in FIG. 11(a) of the cited article. Each comparison signal comprises one transient between two states. The transients of the comparison signals are mutually shifted and do not substantially overlap.

The combining part in FIG. 10 of the cited article comprises resistors Ra, Rb, Rc, Rd and the connections between these resistors and the differential transistor pairs. The combining part combines the 16 comparison signals to a folding signal, which folding signal is illustrated in FIG. 11(c) of the cited article. Effectively, the folding signal is a multiplex of the total of 16 transients in the comparison signals.

A disadvantage of the A/D converter described in the cited article is that it has a relatively low input sensitivity. For a full-scale digital output signal, the total of 16 transients needs to be passed in each of the four folding signals. This is only possible if the peak-peak voltage of the input signal Vin exceeds the difference between the highest and the lowest reference voltages supplied to the differential transistor pairs. Since the tap voltage Vtap is 130 mV, the difference between the highest and lowest reference voltages is 15 times 130 mV, which is about 2 Volts. Hence, the peak-peak voltage of the input signal Vin needs to be about 2 Volts for a full-scale digital output signal.

SUMMARY OF THE INVENTION

It is an object of the invention to provide an A/D converter which has a higher sensitivity than the prior-art A/D converter described above.

In accordance with a first aspect of the invention, the each folding amplifier of such an A/D converter comprises:

- comparison means for providing, in response to an input signal, a plurality of comparison signals having overlapping, mutually shifted transients;
- limiting means for providing, in response to said plurality of comparison signals, a plurality of limited signals having substantially non-overlapping transients; and
- combining means for combining said plurality of limited signals to provide a folding signal.

In contrast to the prior-art A/D converter, the comparison part in an A/D converter according to the invention provides comparison signals whose transients overlap. Each transient is associated with a specific voltage—or current—variation in the input signal. If the transients overlap, the peak-peak input signal variation needed to pass all the transients may be smaller than that in the prior-art A/D converter.

In further contrast to the prior-art A/D converter, an A/D converter according to the invention incorporates a limiting part arranged between the comparison part and the combining part. The limiting part effectively selects a portion of the transient in a comparison signal for transfer to the folding signal. This selection makes it possible that each transient in the folding signal mainly results from the transient in one comparison signal only. The latter is important for a satisfactory accuracy and linearity of the A/D converter.

Thus, the invention allows a combination of a relatively high input sensitivity, on the one hand, and a relatively high accuracy, on the other hand. This combination is not possible in the prior-art A/D converter. If the tap voltage is significantly lowered so as to achieve a higher input sensitivity, the accuracy of the prior art A/D converter is seriously affected, as is illustrated in FIG. 12 of the cited article. In the invention, the limiting part effectively prevents such a loss of accuracy.

In accordance with a second aspect of the invention, a receiver incorporates an A/D converter in accordance with the first aspect of the invention. The high sensitivity of such an A/D converter makes it particularly suitable for use in a receiver. The received signal, which may be relatively weak, needs to be amplified only moderately to make it suitable for A/D conversion. Accordingly, the amplifiers which precede the A/D converter need only provide a relatively small gain. This is favorable in view of stability and power consumption. The higher the gain of a high-frequency amplifier, the more power it will consume and the more sensitive it will be to parasitic coupling between input and output, which may even cause an instability.

In accordance with a third aspect of the invention, a folding amplifier comprises those features which are also part of the folding amplifier in the A/D converter in accordance with the first aspect of the invention. Such a folding amplifier may be used in implementations, other than A/D converters, in which a high input sensitivity is required.

The features of the invention wherein said limiting means comprise a plurality of combiners for combining respective groups of comparison signals having substantially non-overlapping mutually shifted transients to provide a plurality of intermediate folding signals having overlapping, mutually shifted transients; and a plurality of limiters having inputs coupled to receive said plurality of intermediate folding signals and outputs coupled to said combining means, and wherein the limiting means further comprises a plurality of further combiners for combining respective groups of limited intermediate folding signals having substantially non-overlapping, mutually shifted transients to provide a plurality of further intermediate folding signals having overlapping, mutually shifted transients; and a plurality of further limiters having inputs coupled to receive said plurality of further intermediate folding signals and outputs coupled to said combining means, contribute to a high accuracy, a low power consumption and a low component count. The features of the invention wherein said limiter further comprises a plurality of further combiners for combining respective groups of limited intermediate folding signals having substantially non-overlapping, mutually shifted transients to provide a plurality of further intermediate folding signals having overlapping, mutually shifted transients; and a plurality of further limiters having inputs coupled to receive said plurality of further intermediate folding signals and outputs coupled to said combining means, are notably advantageous for an implementation using a relatively large number of comparison signals.

The features of the invention wherein each combiner has three inputs, each input being coupled to receive an intermediate folding signal, each further combiner has three inputs, each input being coupled to receive a further intermediate folding signal, and said comparison means is arranged to provide a gain in the transients of said plurality of comparison signals, contribute to a high accuracy.

These and other aspects, features and advantages will be apparent from and elucidated with reference to the embodiments described hereinafter.

BRIEF DESCRIPTION OF THE DRAWINGS

In the drawings:

FIG. 3 is a block diagram of a second embodiment of a folding amplifier according to the invention;

FIGS. 6a, 6b, 6c, 6d, 6e and 6f are graphs of comparison signals, intermediate folding signals, limited intermediate folding signals, further intermediate folding signals, limited signals and a folding signal, respectively, in the embodiment of FIG. 5;

FIG. 7b is a graph illustrating a possible reference voltage setting for the comparison part shown in FIG. 7a;

Throughout the drawings, like reference signs denote like elements and parts.

DESCRIPTION OF THE PREFERRED EMBODIMENTS

First, the basic principle of the invention is explained in greater detail. This will be done with reference to three embodiments of folding amplifiers according to the invention. Secondly, an implementation of one of these folding amplifier embodiments is presented. Thirdly, an embodiment of an A/D converter and an embodiment of a receiver are presented, which are products in which the invention can be employed. Fourthly, aspects and particulars of the invention, as well as advantages related thereto, are highlighted with reference to the embodiments presented. Finally, to illustrate the scope of the invention, some alternative embodiments and implementations are touched upon.

Figure 1:
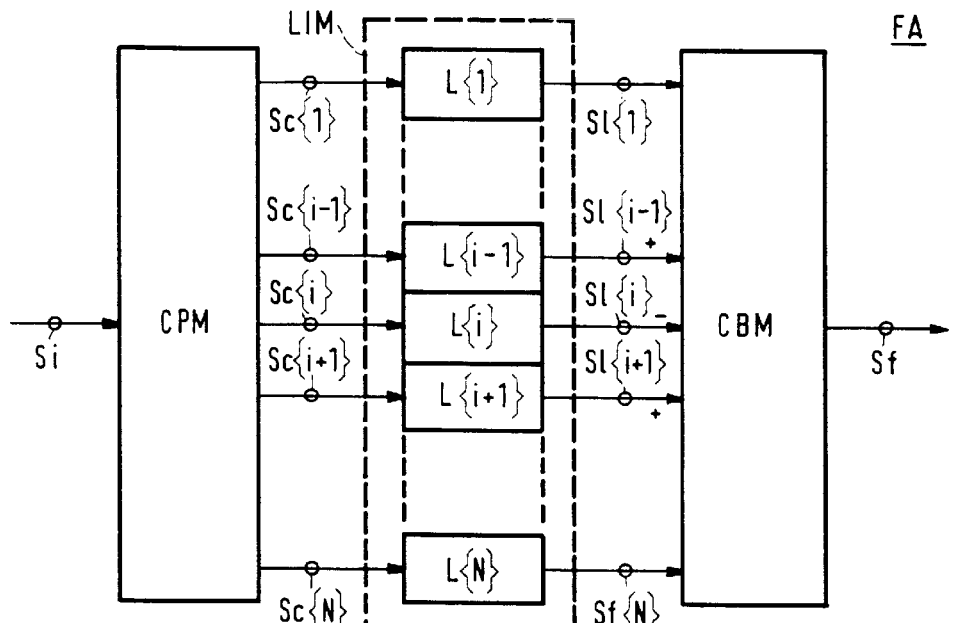
FIG. 1 is a block diagram of a first embodiment of a folding amplifier according to the invention.

FIG. 1 shows a first embodiment of a folding amplifier according to the invention. The folding amplifier receives an input signal Si and provides, in response, a folding signal Sf. The folding amplifier comprises three main parts: a comparison part CPM, a limiting part LIM and a combining part CBM.

Figure 2A:
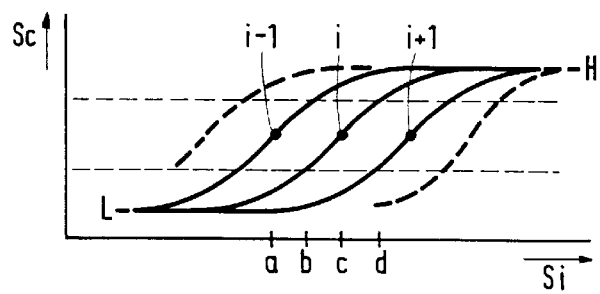
FIGS. 2a, 2b and 2c are graphs of, comparison signals, limited signals and a folding signal, respectively, in the embodiment of FIG. 1.

The comparison part CPM provides a plurality of N comparison signals $Sc(1) \ldots Sc\{N\}$ in response to the input signal Si. The relation between three comparison signals $Sc\{i-1\}$, $Sc\{i\}$ and $Sc\{i+1\}$ and the input signal Si is illustrated in FIG. 2a. More specifically, FIG. 2a shows the transients of these three comparison signals between their two possible "high" (H) and "low" (L) states, respectively. The transients are mutually shifted; each transient occurs in a specific range of the signal Si.

The limiting part LIM comprises an array of limiters $L\{1\} \ldots L\{N\}$. Each limiter $L\{.\}$ receives a comparison signal $Sc\{.\}$ and provides, in response, a limited signal $Sl\{.\} \ldots Sl\{N\}$. Thus, limiters $L\{i-1\}$, $L\{i\}$ and $L\{i+1\}$ shown in FIG. 1 provide three respective limited signals $Sl\{i-1\}$, $Sl\{i\}$ and $Sl\{i+1\}$ in response to the three respective comparison signals $Sc\{i-1\}$, $Sc\{i\}$ and $Sc\{i+1\}$. The relation between the three limited signals $Sl\{i-1\}$, $Sl\{i\}$ and $Sl\{i+1\}$ and the input signal is shown in FIG. 2b.

Figure 2B:
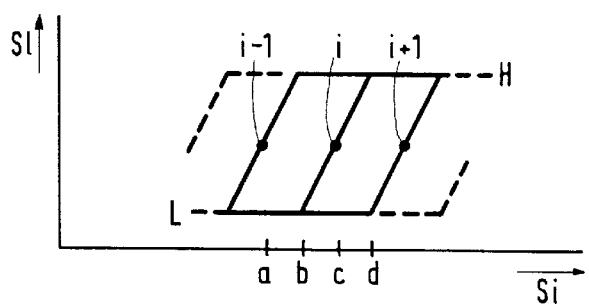

In combination with FIG. 2b, FIG. 2a illustrates that the limiting part LIM effectively selects portions of the transients in the comparison signals. FIG. 2a comprises two dotted horizontal lines which represent the limiting boundaries of the limiting part LIM. If, for example, the value of the comparison signal $Sc\{i\}$ is below the lower dotted horizontal line in FIG. 2a, the limiter $L\{i\}$ provides a limited signal $Sl\{i\}$ which is in the L-state. If, on the other hand, the value of the comparison signal $Sc\{i\}$ is above the upper horizontal dotted line in FIG. 2a, the limited signal $Sl\{i\}$ is in the H-state. Only when the value of the comparison signal $Sc\{i\}$ is in between the horizontal dotted lines, does the limited signal $Sl\{i\}$ vary with the comparison signal $Sl\{i\}$. The same applies to the other comparison signals and the corresponding limited signals. Hence, the limiting part LIM effectively selects portions of the transients in the plurality of comparison signals Sc{1} ... Sc{N} for transfer to the combining part CBM.

When comparing FIG. 2a with FIG. 2b, it can be seen that, in contrast to the plurality of comparison signals Sc{1} ... Sc{N}, the transients in the plurality of limited signals Sl{1} ... Sl{N} do not overlap. This is due to the limiting of the comparison signals. Let it be assumed, for example, that the value of the input signal Si is "a" as indicated on the horizontal axis in FIG. 2a. In that case, the value of the comparison signal Sc{i-1} is symmetrically in between the limiting boundaries indicated by the two horizontal dotted lines in FIG. 2a. The value of the comparison signal Sc{i} also lies on the transient of this signal between the H-state and the L-state. However, the latter value is below the lower limiting boundary. Accordingly, the limited signal Sl{i} is in the L-state when the input signal value is "a", as shown in FIG. 2b, whereas the limited signal Sl{i-1} is in a transient between the L-state and the H-state.

Starting from the value "a", the value of the limited signal Sl{i-1} will continue to increase with an increasing input signal Si, as shown in FIG. 2b, until the latter signal reaches the value "b". In the latter case, the value of the comparison signal Sc{i-1} is on the upper limiting boundary and the value of the comparison signal Sc{i} is on the lower limiting boundary. If, starting from the value "b", the input signal Si increases further, for example to a value "c", the comparison signal Sc{i-1} will be limited. That is, the limited signal Sl{i-1} will no longer vary with the input signal Si, but remains in the H-state.

When the input signal value increases from "b" to "c", the value of the comparison signal Sc{i}, on the other hand, will fall between the limiting boundaries. It will continue to do so until a value "d" is reached. Accordingly, the limited signal Sl{i} will vary with the input signal Si in between the values "b" and "d", whereas the limited signals S{i-1} and Sl{i+1} will not. When the input signal further increases, exceeding the value "d", the comparison signal Sc{i} will be outside the limiting boundaries, whereas the comparison signals Sc{i+1} will be inside these boundaries. Accordingly, the limited signal Sl{i} will be fixed in the H-state, and the limited signal Sl{i+1} will be in a transient between the L-state and the H-state.

Thus, the limiting part LIM, shown in FIG. 1, effectively removes the overlap in transients in the plurality of comparison signals Sc{1} ... Sc{N}. The combining part CBM, also shown in FIG. 1, effectively pastes together the non-overlapping transients in the plurality of limited signals Sl{i} ... Sl{N} they receive, to produce the folding signal Sf.

Figure 2C:
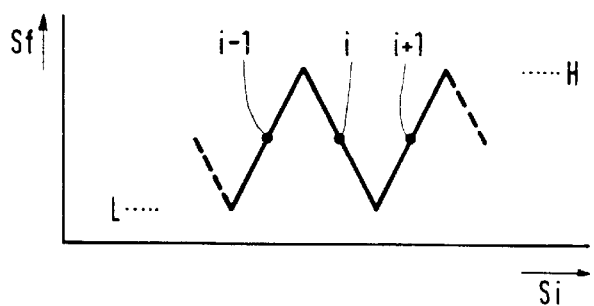

FIG. 2c illustrates the folding signal Sf provided by the combining part CBM. The transients denoted i-1, i and i+1 in the folding signal Sf result from the transients in the limited signals Sl(i-1), Sl(i) and Sl(i+1), respectively. The folding signal Sf provided by the embodiment shown in FIG. 1 will comprise a maximum of N transients. That is, the number of transients equals the number of comparison signals, with mutually shifted transients, provided by the comparison part.

In FIG. 2c, the transient i is inverted with respect to the associated transient in the limited signal Sl{i}, whereas the other transients, i+1 and i-1, are not. The relation between the folding signal Sf and the limited signals Sl(i-1), Sl(i) and Sl(i+1) can be expressed as follows:

$$Sf= \ldots +Sl\{i-1\}-Sl\{i\}+Sl\{i+1\} \ldots$$

That is, the combining part CBM, shown in FIG. 1, combines the limited signals Sl{1} ... Sl{N} with alternating signs.

FIG. 3 shows a second embodiment of a folding amplifier according to the invention. Similarly as in FIG. 1, the folding amplifier shown in FIG. 3 can be divided into three functional parts: a comparison part CPM, a limiting part LIM and a combining part CBM. However, in contrast to FIG. 1, the number of limited signals Sl supplied to the combining part CBM, in FIG. 3, is unequal to the number of comparison signals Sc.

Figure 4A:
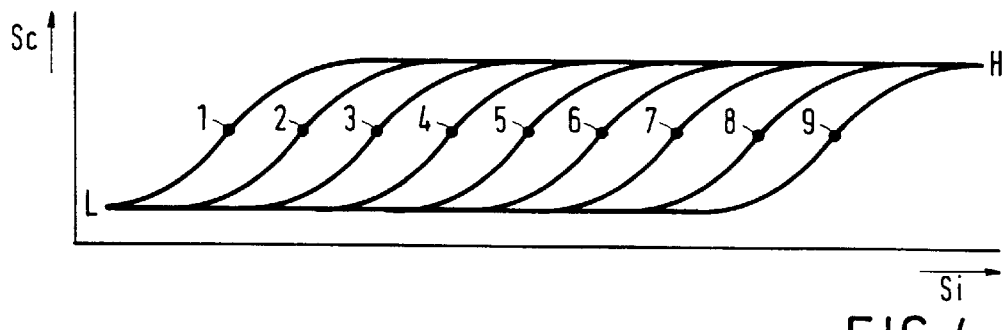
FIGS. 4a, 4b, 4c and 4d are graphs of comparison signals, intermediate folding signals, limited signals and a folding signal, respectively, in the embodiment of FIG. 3.

The comparison part CPM in FIG. 3 provides 9 comparison signals Sc1 ... Sc9 as shown in FIG. 4a. The 9 comparison signals may be divided into three groups of three comparison signals with non-overlapping transients. Comparison signals Sc1, Sc4 and Sc7 form a first group of comparison signals with non-overlapping transients. Comparison signals Sc2, Sc5 and Sc8 form a second group. Comparison signals Sc3, Sc6 and Sc9 form a third group.

The limiting part LIM comprises 3 combiners C1, C2 and C3, receiving the first, second and third groups of comparison signals, respectively. The operation of combiners C1, C2 and C3 in FIG. 3 is similar to the operation of the combining part CBM in FIG. 1. Each combiner effectively multiplexes the transients in a plurality of comparison signals into a single output signal, namely an intermediate folding signal. The combiner C1 combines the first group of comparison signals Sc1-Sc4-Sc7 to provide a first intermediate folding signal SifI. Likewise, the combiners C2 and C3 combine the second group of comparison signals Sc2-Sc5-Sc8 and a third group Sc3-Sc6-Sc9, to provide first and third intermediate folding signals SifII and SifIII, respectively.

Figure 4B:
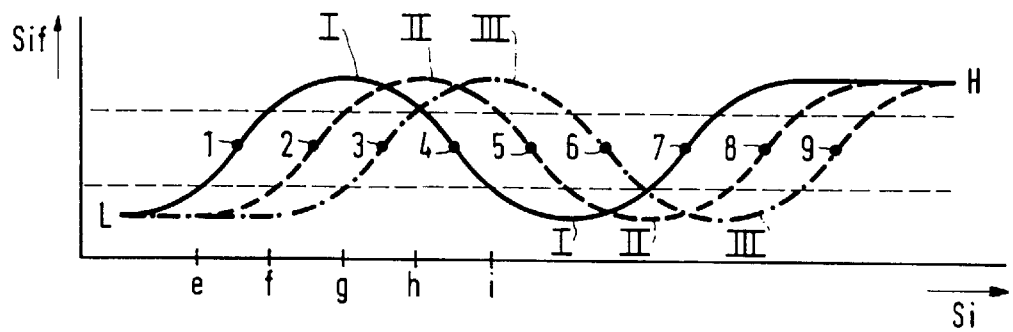

FIG. 4b shows the first, second and third intermediate folding signals SfI, SfII and SfIII. The relation between comparison signals and the intermediate folding signals is apparent from FIGS. 4a and 4b. The relation can be expressed as:

$$SifI=Sc1-Sc4+Sc7$$

$$SifII=Sc2-Sc5+Sc8$$

$$SifIII=Sc3-Sc6+Sc9$$

In FIG. 4b, transients are denoted by the same reference numerals as the comparison signal Sc from which they originate. Thus, intermediate folding signal SifI comprises three transients 1, 4 and 7, and intermediate folding signals SifII and SifIII comprises transients 2,5,8 and 3,6,9, respectively.

Figure 4C:
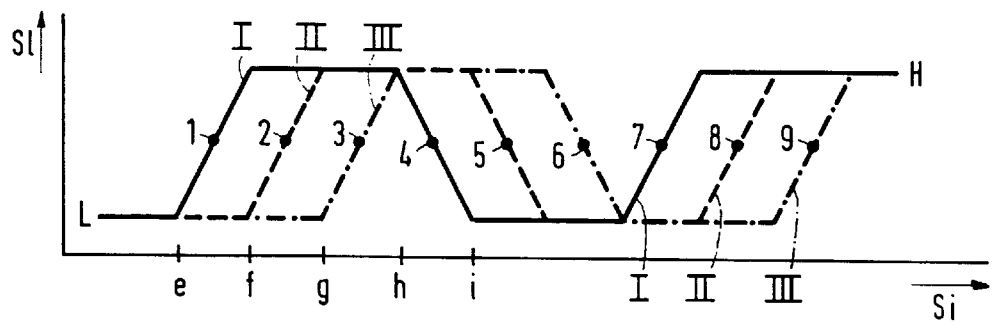

The limiting part LIM, shown in FIG. 3, further comprises 3 limiters L1, L2 and L3, which receive the intermediate folding signals SifI, SifII and SifIII,respectively, shown in FIG. 4b. In response to these signals, the limiters L1, L2 and L3 provide limited signals SlI, SlII and SlIII, respectively, which limited signals are shown in FIG. 4c. The operation of any of the limiters L1, L2 and L3, shown in FIG. 3, is similar to the operation of any of the limiters L{1} ... L{N} shown in FIG. 1. Similarly as in FIG. 2a, the limiting boundaries of limiters L1, L2 and L3 are represented in FIG. 4b by dotted horizontal lines. Only the portion of a transient at the input of a limiter which falls between the limiting boundaries is transferred to the output.

For example, for values of the input signal Si in between "e" and "f", indicated in FIG. 4b, transient 1 of the intermediate folding signal SifI is within the limiting boundaries. Accordingly, the limited signal SlI has a corresponding transient 1, shown in FIG. 4c, in between the values "e" and "f" of the input signal Si. On the other hand, the values of intermediate folding signals SifII and SifIII remain below the lower limiting boundary between "e" and "f", as shown in FIG. 4b. Consequently, the limited signals SlII and SlIII are in the L-state, as shown in FIG. 4c.

If, however, the input signal value is in between "f" and "g", transient 2 of the intermediate folding signal SifII is in between the limiting boundaries, whereas the intermediate folding signal SifI is above the upper limiting boundary and the intermediate folding signal SifIII is below the lower limiting boundary. Consequently, the limited signal SifII has a transient 2, which corresponds to the transient 2 in the intermediate folding signal, whereas the limited signals SlI and SlIII are in the H-state and L-state, respectively. Likewise, in between the values "g" and "h" of the input signal Si, a portion of the transient 3 in the intermediate folding signal SifIII is effectively selected, and in between the values "h" and "i", a portion of the transient 4 in the intermediate folding signals SifI is selected, and so on.

The limiting part LIM in FIG. 3, similarly as the limiting part LIM in FIG. 1, effectively selects non-overlapping portions of transients in the comparison signals Sc1 ... Sc9. In addition, the limiting part LIM in FIG. 3 supplies these selected portions to the combining means CBM in a multiplexed form. That is, each of the limited signals SlI, SlII, SlIII, received by the combining part CBM, comprises three non-overlapping portions of transients in three comparison signals. This is in contrast to FIG. 1 in which each of the limited signals comprises one non-overlapping portion of a transient only.

The combining part CBM in FIG. 3 provides the folding signal Sf by combining the limited signals SlI, SlII and SLIII as follows:

$$Sf = SlI - SlII + SlIII$$

Figure 4D:
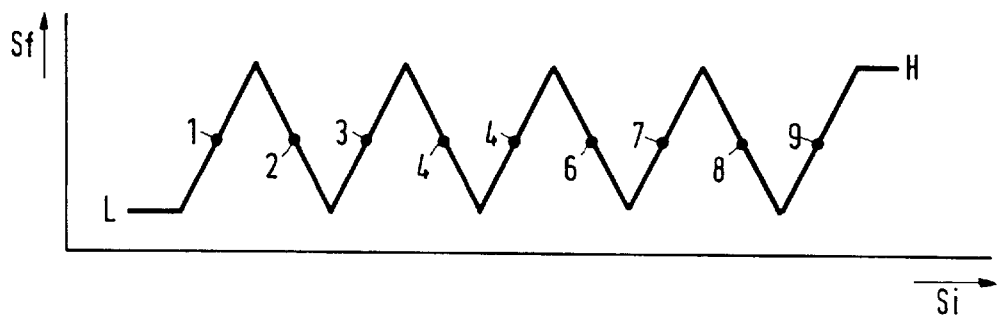

The folding signal Sf, shown in FIG. 4d, comprises 9 transients 1 ... 9. Each of these transients 1 ... 9 has a corresponding transient 1 ... 9 in one of the three limited signals SlI, SlII or SlIII shown in FIG. 4c. Transients 2, 5 and 8 in FIG. 4d are inverted with respect to the corresponding transients 2, 5 and 8 in FIG. 4d, because the combining part effectively inverts the limited signal SlII, as indicated by the minus (−) sign in the above expression.

Figure 5:
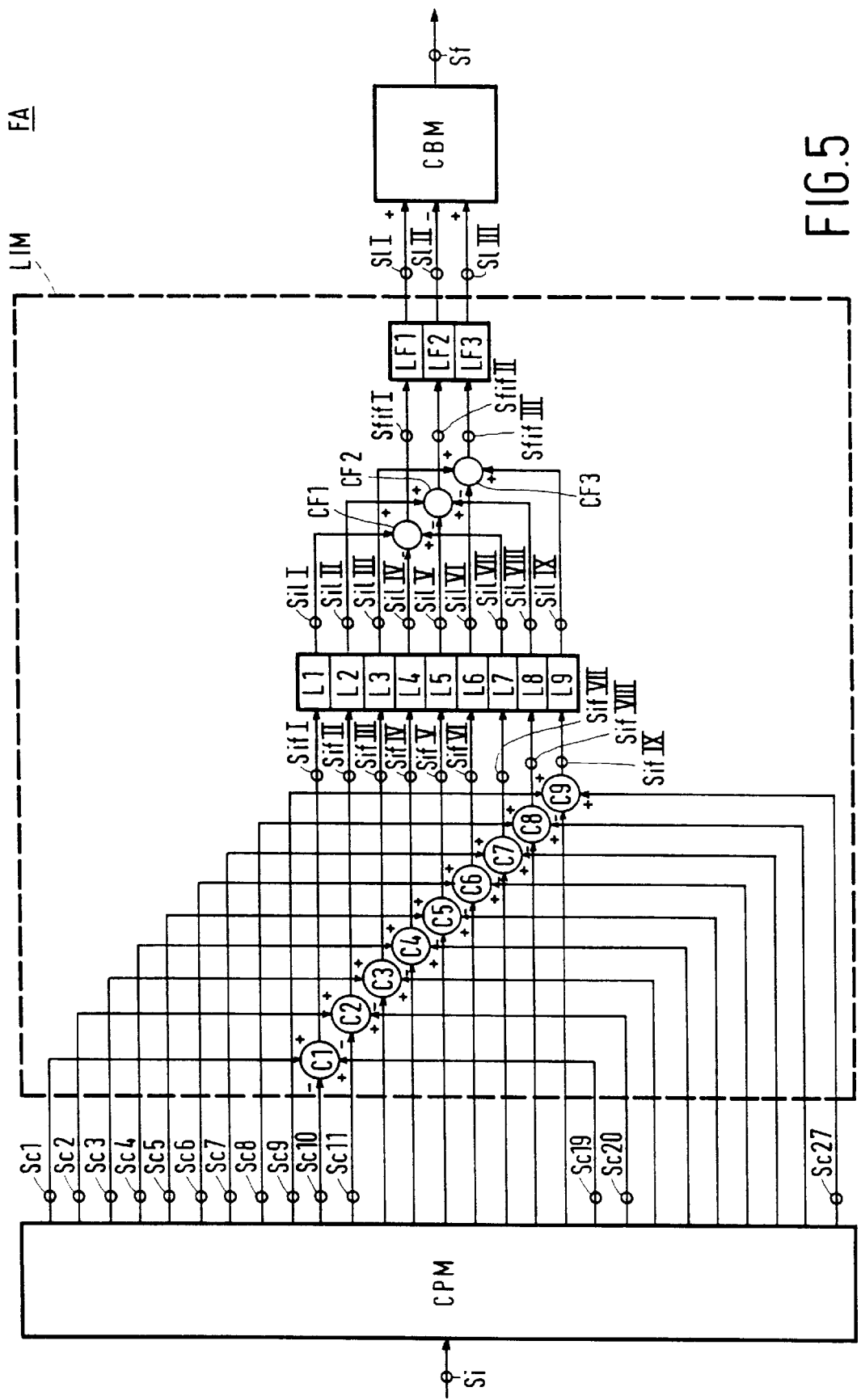
FIG. 5 is a block diagram of a third embodiment of a folding amplifier according to the invention.

FIG. 5 shows a third embodiment of a folding amplifier according to the invention. Similarly as in FIGS. 1 and 3, there are three main functional blocks in FIG. 5: a comparison part CPM, a limiting part LIM and a combining part CBM. Furthermore, Similarly as in FIG. 3, the limiting part LIM in FIG. 5 effectively multiplexes comparison signals. However, there are two major differences between the folding amplifier shown in FIGS. 5 and the one shown in FIG. 3.

First, the comparison part CPM in FIG. 5 provides 27 comparison signals Sc1 ... Sc27, which is significantly more than the 9 comparison signals Sc1 ... Sc9 provided by the comparison part CPM in FIG. 3. Furthermore, the transients of the comparison signals Sc1 ... Sc27 in FIG. 5 have more mutual overlap than those in the comparison signals Sc1 ... Sc9 in FIG. 3. FIG. 6a partly shows the comparison signals Sc1 ... Sc13. The comparison signals Sc14 ... Sc27, which are not shown in FIG. 6a, follow the same pattern for the partly shown comparison signals Sc1 ... Sc13. That is, the higher the numeral in the designation of a comparison signal, the more its transient is equidistantly shifted to the right in FIG. 6a.

Secondly, the limiting part LIM in FIG. 5 effectuates two steps of multiplexing and successive limiting. This is in contrast to the limiting part LIM in FIG. 3 which effectuates only one such step. In the limiting part shown in FIG. 5, a first multiplexing and successive limiting step is effectuated by combiners C1 ... C9 and limiters L1 ... L9 coupled thereto. A second step is effectuated by further combiners CF1 ... CF3 and further limiters LF1 ... LF3 coupled thereto.

In the first step, each of the combiners C1 ... C9 in FIG. 5 combines a group of three comparison signals having non-overlapping transients. As a result, 9 intermediate folding signals SifI ... SifIX are obtained. Combiner C1 combines comparison signals Sc1, Sc10 and Sc19 to provide intermediate folding signal SifI:

$$SifI = Sc1 - Sc10 + Sc19$$

Combiner C2 provides the intermediate folding signal SfifII by combining comparison signals Sc2, Sc11 and Sc20:

$$SifII = Sc2 - Sc11 + Sc20,$$

and so on, such that, finally, combiner C9 combines comparison signals Sc9, Sc18 and Sc27 to provide intermediate folding signal SifIX:

$$SifIX = Sc9 - Sc18 + Sc27$$

FIG. 6b partly shows the intermediate folding signals SifI ... SifIX provided by combiners C1 ... C9, respectively. Each intermediate folding signal SifI ... SifIX comprises 3 transients. In FIG. 6b, the transients are designated by the same reference numerals as the comparison signal from which they originate. For example, the intermediate folding signal SifI comprises the transients 1, 10 and 19, the latter transient not being shown in FIG. 6b. Note that the transient 10 in the intermediate folding signal SifI, shown in FIG. 6b, is inverted with respect to the transient 10 in the comparison signal Sc10. The same applies to the transients 11, 12 and 13 in FIGS. 6a and 6b. This is due to fact that the comparison signals Sc10 ... Sc18 are effectively inverted by combiners C1 ... C9, respectively.

The 9 intermediate folding signals SifI ... SifIX are supplied to an array of limiters L1 ... L9 shown in FIG. 5. In response to the intermediate folding signals SifI ... SifIX, the limiters L1 ... L9 provide intermediate limited signals SilI ... SilIX, which are partly shown in FIG. 6c. The limiting boundaries of the limiters L1 ... L9 are indicated in FIG. 6b by two horizontal dotted lines. Only the part of a transient in between these limiting boundaries is transferred to the output of the relevant limiter and is, consequently, present in the relevant intermediate limited signal.

In the second multiplexing and limiting step, each of the further combiners CF1 ... CF3 combines a group of three intermediate limited signals having non-overlapping transients. For example, further combiner CF1 combines intermediate limited signals SilI, SilIV and SilVII, shown in FIG. 6c in full lines. The further combiners CF1, CF2 and CF3 provide further intermediate folding signals SfifI, SfifII, SfifIII, respectively, which are the results of the following operations:

$$SfifI = SilI - SilIV + SilVII$$

$$SfifII = SilII - SilV + SilVIII$$

$$SfifIII = SilIII - SilVI + SilIX$$

FIG. 6d partly shows the further intermediate folding signals SfifI, SfifII and SfifIII provided by the combiners CF1, CF2 and CF3, respectively. Similarly as in FIGS. 6b and 6d, the transients in FIG. 6d are denoted by the same reference numerals as the comparison signal from which they originate. Each of the further intermediate folding signals SfifI, SfifII and SifIII comprises 9 transients. For example, the further intermediate folding signal SifI comprises the transients 1, 4, 7, 10, 13, 16, 19, 22 and 25, the latter four transients not being shown in FIG. 6d. Note that the transients 4 and 10 in the further intermediate folding signal SfifI, partly shown in FIG. 6d, are inverted with respect to the transients 4 and 10 in the comparison signals Sc4 and Sc10, respectively, partly shown in FIG. 6a. The same applies to the transients 16 and 22, which are neither shown in FIG. 6a nor in FIG. 6d. Whether or not any transient in the further intermediate folding signals SfifI . . . SfifIII is inverted can be determined from the signal flow in FIG. 5. In FIG. 5, inputs of the combiners C1 . . . C9 and further combiners CF1 . . . CF3 are designated by a "−" or "+" sign to indicate that the relevant signal is inverted, or not inverted, respectively.

The 3 further intermediate folding signals SfifI, SfifII and SfifIII are supplied to an array of further limiters LF1, LF2 and LF3 shown in FIG. 5. The limiting boundaries of the further limiters LF1, LF2 and LF3 are indicated in FIG. 6d by two horizontal dotted lines. Any of the intermediate folding signals SifI, SifII or SifII having a value below the lower boundary, or a value above the upper boundary, produces a corresponding limited signal SlI, SlII or SlIII which is the L-state or the H-state, respectively. It can be understood from FIG. 6d that the further limiters LF1, LF2 and LF3 effectively select non-overlapping portions of the transients in the further intermediate signals SfifI, SfifII and SfifIII, respectively. These selected portions produce the transients in the limited signals SlI, SlII and SlIII, respectively, which are partly shown in FIG. 6e.

The combining part CBM, shown in FIG. 5, receives the limited signals SlI, SlII and SlII provided by the limiting part LIM and combines these signals in the following manner to obtain the folding signal Sf:

$$Sf = SlI - SlII + SlIII$$

FIG. 6f partly shows the folding signal Sf, which comprises 27 transients 1 . . . 27. These transients 1 . . . 27 correspond to the transients in the respective comparison signals Sc1 . . . Sc27, partly shown in FIG. 6a.

The three embodiments shown in FIGS. 1, 3 and 5 and discussed above illustrate the following basic concept of the invention. In all three embodiments, the comparison part CMP provides comparison signals having overlapping mutually shifted transients, as shown in FIGS. 2a, 4a and 6a, respectively. The limiting part LIM effectively selects non-overlapping portions of these transients, as illustrated by the combinations of FIGS. 2a–2b, 4b–4c, 6b–6c and 6d–6e. The combining part CBM effectively multiplexes these selected portions to provide the folding signal Sf.

Figure 7A:
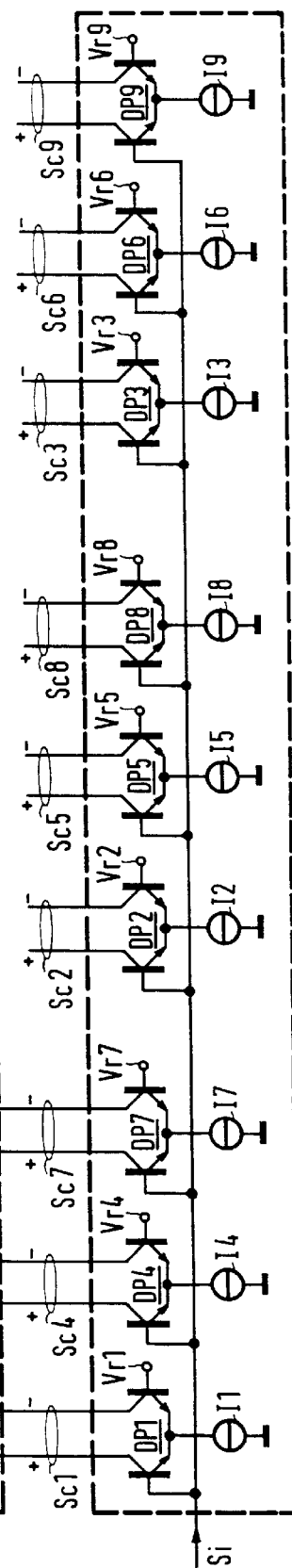
FIG. 7a is a circuit diagram of a comparison part and a combiner in an implementation of the embodiment shown in FIG. 3.
Figure 8:
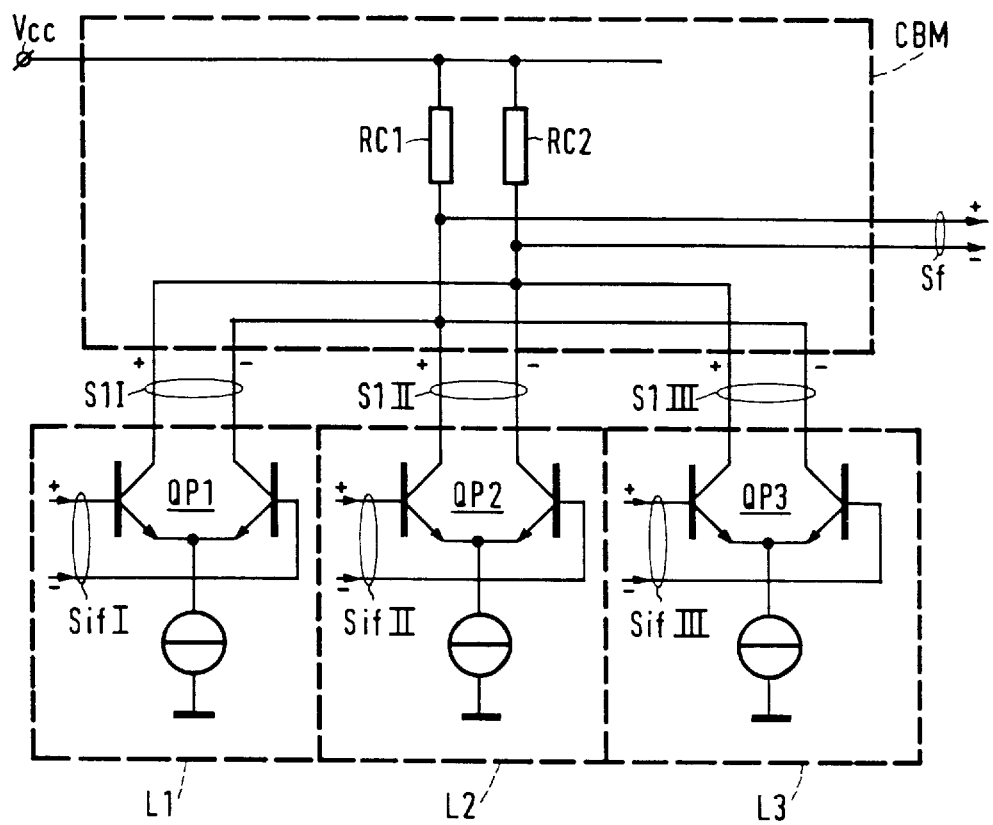
FIG. 8 is a circuit diagram of limiters and a combining part in an implementation of the embodiment of FIG. 3.

A possible implementation of the embodiment shown in FIG. 3 is presented below and illustrated in FIGS. 7a and 8. FIG. 7a shows the circuitry of the comparison part CPM and the circuitry of combiner C1. The circuitry of the other combiners C2 and C3 is similar to that of combiner C1. FIG. 8 shows circuitry of the three limiters L1, L2 and L3 and circuitry of the combining part CBM.

In FIGS. 7a and 8, the comparison signals, the intermediate folding signals, the limited signals and the folding signal are differential signals. The non-inverted and inverted parts of these differential signals are designated + and −, respectively. Furthermore, in FIGS. 7a and 8, the intermediate folding signals and the folding signals are voltages, whereas the comparison signals and limited signals are currents.

In the implementation of the embodiment shown in FIG. 3, the comparison part CPM comprises 9 differential transistor pairs DP1 . . . DP9. The common emitters of the differential transistor pairs DP1 . . . DP9 receive bias currents from tail current sources I1 . . . I9, respectively. The tail current sources I1 . . . I9 provide substantially equal bias currents of, approximately, the value Itail. In each differential transistor pair DP1 . . . DP9, one transistor receives the input signal Si at its base, whereas the other transistor receives a reference voltage Vr1 . . . Vr9, respectively.

The comparison signals Sc1 . . . Sc9 are the differential collector currents of the differential transistor pairs DP1 . . . DP9, respectively. The reference voltages Vr1 . . . Vr9 determine the location of the respective transients in the comparison signals Sc1 . . . Sc9. For example, when the input signal Si has a value equal to Vr1, the comparison signal Sc1 is substantially in the center of its transient. This center is indicated in FIG. 4a as a dot associated with the reference numeral 1. The same applies to the other reference voltages and respective comparison signals.

The differential transistor pairs DP1 . . . DP9 can be divided into three groups, depending on the combiner C1, C2 or C3 to which they supply comparison signals. A first group of differential transistor pairs DP1-DP4-DP7 supplies a group of comparison signals Sc1-Sc4-Sc7 to combiner C1. The other two groups of differential transistor pairs DP2-DP5-DP8 and DP3-DP6-DP9 supply groups of comparison signals Sc2-Sc5-Sc8 and Sc3-Sc6-Sc9 to the combiners C2 and C3, respectively.

Figure 7B:
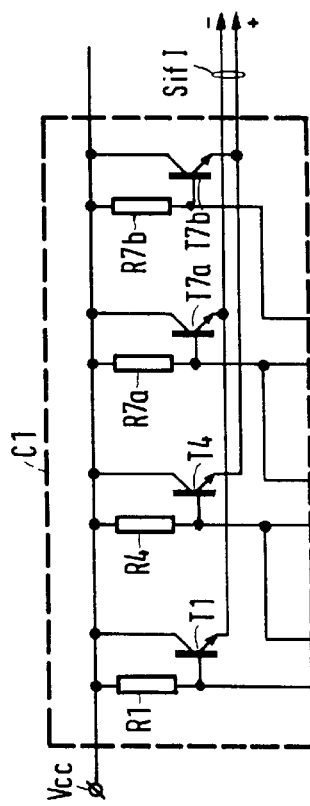

Preferably, each group of differential transistor pairs provides comparison signals having substantially non-overlapping transients. This can be achieved by suitably choosing the reference voltages Vr1 . . . Vr9. FIG. 7b illustrates an equidistant reference voltage setting, in which the difference between two successive reference voltages, for example Vr1–Vr2, is Vtap. Consequently, the difference between two successive reference voltages in the groups of differential pairs, for example Vr1–Vr4, is 3·Vtap. If Vtap is sufficiently large, for example Vtap=50 mV in a bipolar transistor implementation, there will be no substantial overlap between the transients in the comparison signals provided by any of the three groups of differential transistor pairs.

The implementation of combiner C1, shown in FIG. 7a, comprises 4 transistors T1, T4, T7a and T7b. The emitters of transistors T1 and T7a and the emitters of transistors T4 and T7b are mutually coupled. The bases of transistors T1, T4, T7a and T7b are coupled to a supply voltage terminal VCC via resistors R1, R4, R7a and R7b, respectively. The resistances of resistors R1, R4, R7a and R7b are substantially equal to the value Rcomb. A voltage Vcc, not shown, is applied to the terminal VCC.

The voltages at the bases of the transistors T1, T4, T7a and T7b depend on the currents flowing through the resistors R1, R4, R7a and R7b. For example, the current flowing through resistor R1 is the non-inverted part of the comparison signal Sc1. The non-inverted part of Sc1 is substantially zero when the input signal Si is more than 100 mV lower than the reference voltage Vr1. On the other hand, when the input signal Si is more than 100 mV higher than the reference voltage Vr1, the tail current of source I1 substantially flows through the resistor R1.

Accordingly, when the input signal Si sweeps from the lowest to the highest value of the input signal range, the voltage at the base of transistor T1 has a transient from Vcc to Vcc−Itail·Rcomb for Si≈Vr1. The inverse applies to the voltage at the base of transistor T7b with respect to reference voltage Vr7. This voltage has a transient from Vcc−Itail·Rcomb to Vcc when the input signal Si sweeps from the lowest to the highest value of the input signal range. The voltages at the bases of transistors T4 and T7a have two transients throughout the range of the input signal Si, namely, a transient from Vcc−Itail·Rcomb to Vcc and a transient from Vcc back to Vcc−Itail·Rcomb again. Having two transients is due to the fact that a combination of two comparison signals is supplied to the resistors R4 and R7a.

The voltage at the common emitters of transistors T1 and T7a is the higher one of the base voltages of these transistors. Accordingly, the one transient at the base of transistor T1, when Si≈Vr1, is effectively multiplexed with the two transients at the base of transistor T7a, when Si≈Vr4 and Si≈Vr7, respectively. The common emitters of transistors Ti and T7a provide the inverted part of the intermediate folding signal SifI, which comprises three transients. Likewise, the common emitters of transistors T4 and T7b provide the non-inverted part of the folding signal SifI, which is a multiplex of the transients at the bases of these transistors.

Referring now to FIG. 8, the limiters L1, L2 and L3 comprise differential transistor pairs QP1, QP2 and QP3 and respective current sources. The intermediate folding signals SifI, SifII and SifIII, which are differential voltages, are applied to the bases of these respective differential transistor pairs. In response, the differential transistor pairs QP1, QP2 and QP3 provide limited signals SlI, SlII and SlIII, respectively, in the form of differential collector currents.

In a bipolar transistor implementation of the limiters L1, L2 and L3 shown in FIG. 8, the limiting boundaries are approximately 200 mV spaced apart. The limiting boundaries are indicated in FIG. 4b by two horizontal dotted lines. The portion of the intermediate folding signals SifI, SifII and SifIII that falls within the limiting boundaries depends on the gain provided by the cascade of the comparison part CMP with the respective combiners C1, C2 and C3.

Referring to FIG. 7a, the gain is the product of the voltage-to-current conversion factor (transadmittance) of the differential transistor pairs DP1 . . . DP9 and the current-to-voltage conversion factor (transimpedance) of the combiners C1, C2 and C3. The transadmittance of the differential transistor pairs DP1 . . . DP9 depends on the tail current Itail provided by the current sources I1 . . . I9, respectively. The transadmittance of the combiner C1 is approximately the resistance Rcomb of the resistors R1, R4, R7a and R7b. The transadmittance of the other combiners C2 and C3, which are similar to the combiner C1, is also Rcomb.

Hence, the portion of a transient which is effectively selected, as illustrated by FIG. 4b, depends inter alia on the following two circuit parameters, namely the tail current value Itail, provided by the current sources I1 . . . I9 shown in FIG. 7a., and the resistance value Rcomb of the resistances R1, R4, R7a, R7b and corresponding resistors in the combiners C2 and C3. By suitably setting these parameters, mutual overlap between transients in the limited signals SlI, SlII and SlIII can be obviated.

The combining part CBM in FIG. 8 comprises two resistors RC1 and RC2, which are coupled to the supply voltage terminal VCC. The combining part CBM further comprises connections between the resistors RC1 and RC2 and the differential pairs QP1, QP2 and QP3. Resistor RC1 is connected to one of the two collectors of each differential transistor pair QP1, QP2 or QP3. Resistor RC2 is connected to the other of the two collectors of each differential transistor pair. Accordingly, a combination of the differential collector currents from all three differential transistor pairs QP1, QP2 and QP3, flows through these resistors RC1 and RC2.

The above-mentioned connections in the combining part CBM of FIG. 8 define the sign of a limited signal in the combination which is made. In FIG. 8, the connections are such that the inverted parts of the limited signals SlI and SlII flow through the resistor RC1 together with the non-inverted part of the limited signal SlIII. Furthermore, the non-inverted parts of the limited signals SlI and SlII flow through resistor RC2 together with the inverted part of limited signal SlIII. The nodes of the resistors RC1 and RC2, which are not coupled to the terminal VCC, provide the non-inverted portion and the inverted portion, respectively, of the folding signal Sf. The operation of the combining part CBM shown in FIG. 8 can be expressed as follows:

$$Sf = Vcc - \{-SlI + SlII - SlIII\} \cdot Rcbm$$

in which expression Vcc is the voltage applied at the terminal VCC and Rcbm is the resistance of the resistors RC1 and RC2. Note that the voltage-to-current conversion, effectuated by the resistors RC1 and RC2, effectively invert the limited signals SlI, SlII and SlIII.

Figure 9:
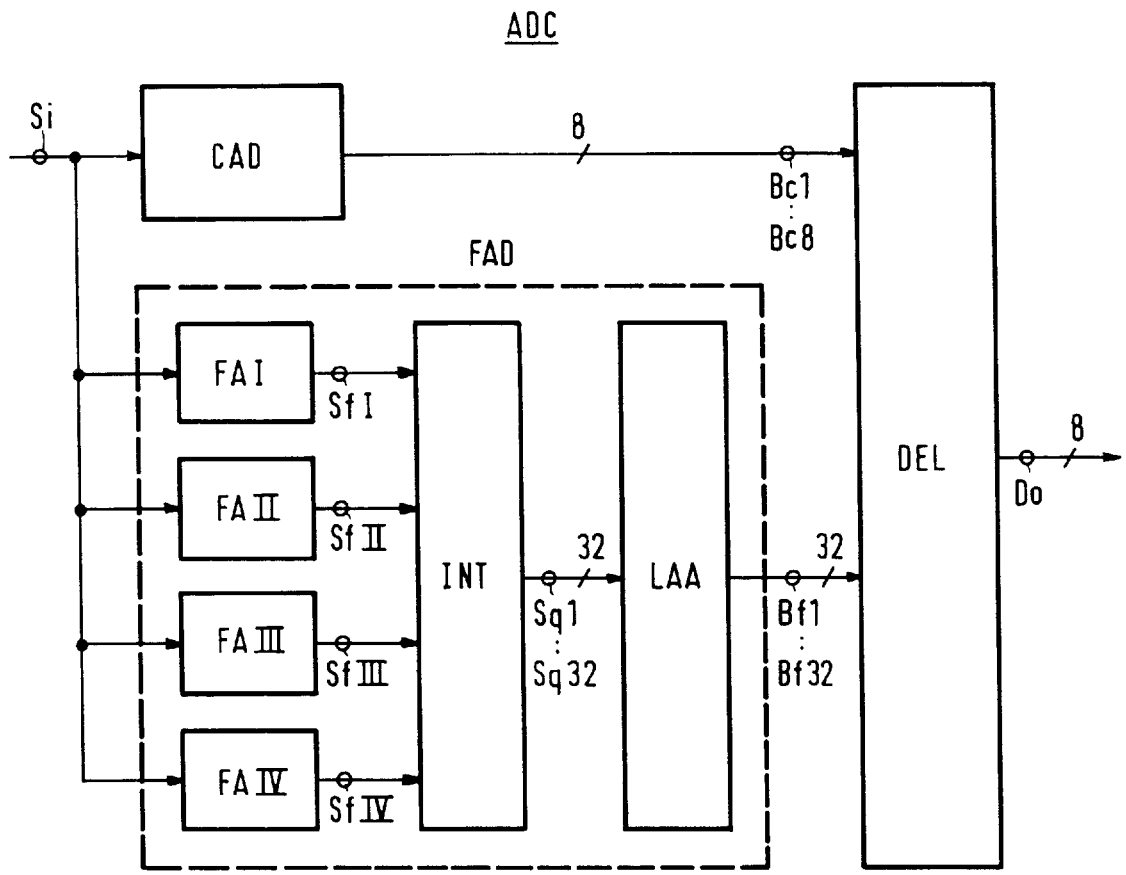
FIG. 9 is a block diagram of an A/D converter comprising folding amplifiers.

FIG. 9 shows an A/D converter incorporating four folding amplifiers FAI . . . FAIV. The A/D converter provides an 8-bit digital output signal Do which is a digital representation of an analog input signal Si.

The 8-bit A/D converter, shown in FIG. 9, comprises three main functional blocks: a course A/D conversion block CAD, a fine A/D conversion block FAD and a digital encoding logic block DEL. The coarse A/D conversion block CAD provides 8 (=$2^3$) coarse latch bits Bc1 . . . Bc8, which roughly indicate the value of the input signal Si. The fine A/D conversion block provides 32 (=$2^5$) fine latch bits Bf1 . . . Bf32, which, together with the coarse latch bits, indicate the value of the input signal Si with 8-bit precision. The digital encoding block DEL encodes these coarse latch bits Bc1 . . . Bc8 and fine latch bits Bf1 . . . Bf32 into the 8-bit digital output signal Do.

Figure 10:
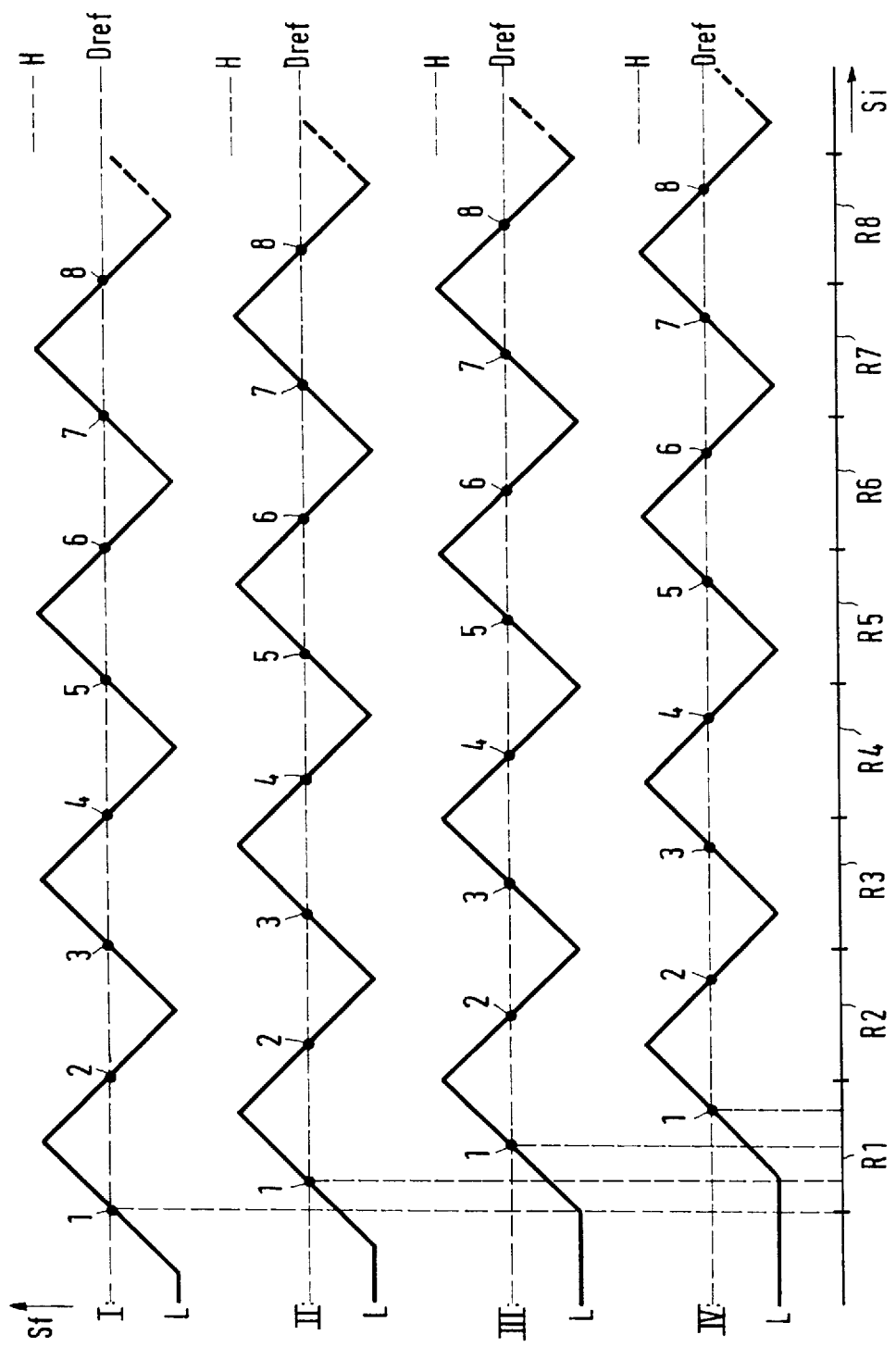
FIG. 10 is a graph of the folding signals in the A/D converter shown in FIG. 9.

More specifically, the fine A/D conversion block FAD comprises the 4 folding amplifiers FAI . . . FAIV, an interpolator INT and an array of 32 latches LAA. The 4 folding amplifiers FAI . . . FAIV provide folding signals SfI . . . SfIV, respectively, as shown in FIG. 10. The folding signals SfI . . . SfIV, and consequently the transients therein, are mutually shifted. The shift between the folding signals can be expressed in terms of phase-shifts. If folding signal SfI is taken as a reference, in other words if SfI has zero (0) phase-shift, then folding signals SfII, SfIII and SfIV are phase-shifted 45, 90 and 135 degrees, respectively.

The interpolator INT derives 32 latch input signals Sq1 . . . Sq32 from 4 folding signals SfI . . . SfIV supplied thereto. Four of the 32 latch input signals Sq1 . . . Sq32 correspond to folding signals SfI . . . SfIV, respectively. The other 28 latch input signals result from interpolations between the folding signals SfI . . . SfIV. Seven interpolations are made between each of the following 4 folding signal combinations SfI-SfII, SfII-SfIII, SfIII-SfIV, SfIV-SfI. For example, 7 interpolations are made between folding signals SfI and SfII, which provide 7 latch input signals having phase-shifts of 5⅝, 11¼, 16⅞, 22½, 28⅛, 33¾, 39⅜ degrees, respectively. The interpolations between the signal combination SfII-SfIII, SfIII-SfIV and SfIV-SfI are identical.

The array of 32 latches LAA effectively decides whether the respective latch input signals Sq1 . . . Sq32 are nearer to the low state L or nearer to the high state H. The values of the fine latch bits Bf1 . . . Bf32 depend on the decisions taken on the respective latch input signals Sq1 . . . Sq32. This can be further explained with reference to FIG. 10. In FIG. 10, broken horizontal lines represent a decision reference level Dref of the array of 32 latches LAA. Depending on whether the folding signals SfI . . . SfIV are below or above the decision reference level Dref, the corresponding respective latch bits are 0 or 1, or vice versa. The same applies to the 28 interpolations between the folding signals SfI . . . SfIV and their respective corresponding latch bits.

The digital encoding logic DEL derives the 8-bit digital output signal Do from fine latch bits Bf1 . . . Bf32 and the coarse latch bits Bc1 . . . Bc8. Referring to FIG. 10, the coarse latch bits Bc1 . . . Bc8 indicate in which of the ranges R1 . . . R8 the value of the input signal Si falls. The fine latch bits Bf1 . . . Bf32 further specify the value of the input signal Si. Referring to FIG. 10, each crossing of the 4 folding signals SfI . . . SfIV and the 28 interpolations (not shown) with the detection reference level is, effectively, a quantization level. Thus, each range R1 . . . R8 comprises 32 quantization levels. The fine latch bits Bf1 . . . Bf32 indicate which of these 32 quantization levels the input signal Si is closest to.

The folding amplifiers FAI . . . FAIV can be implemented as shown in FIGS. 7a and 8 and as described above. In that case, the reference voltages Vr1 . . . Vr9 for each of the folding amplifiers FAI . . . FAIV are chosen to be such that the mutually shifted folding signals SfI . . . SfIV as shown in FIG. 10 are obtained. For example, all folding amplifiers FAI . . . FAIV have the same tap voltage Vtap=60 mV. The reference voltages Vr1 . . . Vr9 for folding amplifier FAII are shifted ¼·Vtap=15 mV with respect to the respective references voltages Vr1 . . . Vr9 for folding amplifier FAII. Similarly, the reference voltages for the folding amplifiers FAIII and FAIV are shifted ¼·Vtap with respect to those of folding amplifiers FAII and FAIII, respectively.

The interpolator INT can be implemented with resistors as described in the cited article. Implementations of the array of 32 latches LAA and of the digital encoding logic DEL can readily be conceived by those skilled in the art.

For example, the coarse A/D conversion block CAD can be implemented as a full-flash 3-bit A/D converter. In that case, it comprises 8 comparators, with 8 different respective reference levels, and 8 latches coupled thereto. Each latch provides a coarse latch bit whose value, 0 or 1, depends on the value of the input signal Si with respect to the reference level of the comparator to which it is coupled. The reference levels are chosen in accordance with the ranges R1 . . . R8 shown in FIG. 10.

Figure 11:
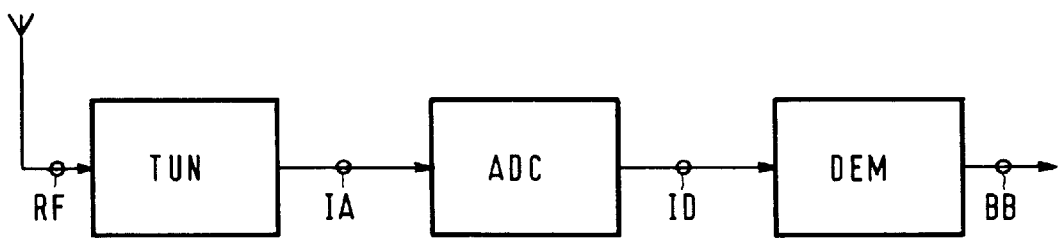
FIG. 11 is a block diagram of a receiver comprising an A/D converter.

FIG. 11 shows a receiver which comprises an A/D converter ADC, a tuner TUN, an A/D converter ADC and a demodulator DEM. The tuner TUN provides an intermediate frequency signal IA, which is a frequency-shifted version of the received transmission signal RF. The A/D converter ADC provides a digital representation ID of the intermediate frequency signal IA, which is a digital intermediate frequency signal ID. The demodulator DEM derives a demodulated baseband signal BB from the digital representation ID of the intermediate frequency signal.

The A/D converter ADC in the receiver shown in FIG. 11 may be the embodiment shown in FIG. 9, in which embodiment the folding amplifiers FAI . . . FAIV may be implemented as shown in FIGS. 7a and 8 and as described above. For example, the tuner TUN may be a conventional tuner comprising one or more of the following elements: mixers, oscillators, high and intermediate-frequency filters and amplifiers. The demodulator DEM may be for example, the combination of digital signal-processing elements in FIG. 1 of U.S. Pat. No. 5,230,011.

Aspects and features of the invention, as well as advantages related thereto, are highlighted below, by way of example, with reference to the embodiments and implementations.

The sensitivity of the A/D converter shown in FIG. 9 is determined by the folding amplifiers FAI . . . FAIV. A full-scale variation in the output signal Do, i.e. an 8-bit variation, requires the input signal Si to cover all relevant transients in the folding signals SfI . . . SfIV, shown in FIG. 10.

According to the invention, the respective folding signals SfI . . . SfIV are derived from comparison signals, provided by the comparison part CPM, having mutually overlapping transients. This is illustrated in FIGS. 2a–2c, 4a–4d and 6a–6f. Since the transients in the comparison signals mutually overlap, a relatively small variation in the input signal Si suffices to cover the transients in the folding signals SfI . . . SfIV, shown in FIG. 10. Accordingly, of the A/D converter shown in FIG. 9, has a relatively high sensitivity, when the invention is employed.

Furthermore, the accuracy and linearity of the A/D converter shown in FIG. 9 are largely determined by the folding amplifiers FAI . . . FAIV. Referring to FIG. 10, the transients in the folding signals SfI . . . SfIV and the transients in the interpolations should, ideally, equidistantly cross with the reference detection level Dref. The more linear the transients in the folding signals SfI . . . SfIV are, the more this ideal is approximated and, consequently, the more linear and accurate the A/D converter shown in FIG. 9 is.

According to the invention, the transients in the respective folding signals SfI . . . SfIV are derived from portions of transients in the comparison signals. This is illustrated in FIGS. 2a–2c, 4a–4d and 6a–6f. The limiting part LIM determines which portions are taken. In FIGS. 2a, 4b and 6b/6d, the limiting boundaries indicated by dotted horizontal lines are such that substantially non-overlapping portions are taken. As a result, the transients in the folding signal Sf are relatively linear, despite the fact that the transients in the comparison signals mutually overlap. Accordingly, the A/D converter shown in FIG. 9 has a satisfactory accuracy and linearity when the invention is employed.

Thus, the invention provides an A/D converter which features a high sensitivity as well as a satisfactory accuracy and linearity. Such an A/D converter is articulary suitable for use in a receiver, for example, in the receiver shown in FIG. 10. The higher the sensitivity of the A/D converter ADC in FIG. 10, the less gain is needed in the tuner TUN. Accordingly, signal distortion, power consumption and potential instabilities are mitigated. Satisfactory accuracy and linearity of the A/D converter in FIG. 10 are required for the demodulator DEM to provide the baseband signal BB with a sufficiently low distortion.

A feature of the embodiments shown in FIGS. 3 and 5 is that combinations of comparison signals are limited. This is in contrast to the embodiment shown in FIG. 1, in which each comparison signal is limited individually. Due to the feature of the former embodiments, these embodiments comprise relatively few elements.

A feature of the embodiment shown in FIG. 5 is that the comparison signals Sc1 . . . Sc27 are effectively limited in two steps, by means of limiters L1 . . . L9 and further limiters LF1 . . . LF3, successively. This feature contributes to the accuracy and linearity of the transients in the folding signal Sf. This can be explained as follows. Consider an embodiment, similar to that of FIG. 3, in which the comparison signals Sc1 . . . Sc27, partly shown in FIG. 6a, were limited in a single step only. In that case, the limiters effectuating this single step should have relatively narrow limiting boundaries, to provide limited signals having substantially non-overlapping transients. In any implementation, limiting boundaries are affected by offsets in the circuitry used. The narrower the limiting boundaries, the more influence any offset will have on the transients in the folding signal Sf. Since the limiting is effectuated in two steps in FIG. 5, with limiting boundaries which are relatively widely spaced apart, the influence of any offset on the folding signal Sf is relatively low.

A feature of the embodiments shown in FIGS. 3 and 5 is that combinations of three signals are made. This feature contributes to the accuracy and linearity of the transients in the folding signals Sf. This can be explained as follows. Consider the implementation, shown in FIG. 7, of the combiner C1 in FIG. 3, which combines comparison signals Sc1, Sc4 and Sc7 into the intermediate folding signal SifI. Any offset between the current sources I1, I4 and I7 will affect the transients in the intermediate folding signal. For example, if the value of the input signal Si is close to the reference voltage Vr4, any offset between the tail currents provided by sources I1 and I7 will affect the relevant transient in the intermediate folding signal SifI. If more signals had to be combined, more current sources would be required and, consequently, more offsets could affect the transients in the combination of signals that is made. In the invention, it has been found that, making combinations of three signals in a folding amplifier, is optimal in this respect.

A feature of the implementation, shown in FIG. 7, of the embodiment of FIG. 3 is that the cascade of the comparison part CPM with the combiner C1 can provide a voltage gain which is substantially larger than 1. This feature contributes to the accuracy and linearity of the transients in the folding signal Sf. The higher the voltage gain provided by the cascade of the comparison part CPM with the combiner C1, the less any offsets in the limiter L1 will influence the transients in the folding signal Sf. The same applies to the cascades of the comparison part CPM with combiners C2 and C3 and any offsets in limiters L2 and L3, respectively.

Evidently, many embodiments and implementations, other than those presented by way of example, are within the scope of the invention as claimed.

To illustrate that the embodiments shown FIGS. 3 and 5 are just two of a great many conceivable embodiments, an embodiment classification is presented first. According to this classification, the embodiment of FIG. 3 has a 3-3 structure and the embodiment of FIG. 5 has a 3-3-3 structure. In the designation of the structure, a horizontal stripe (-) represents an array of limiters. The numeral which precedes the horizontal stripe (-) is the number of signals combined for supply to each limiter in the relevant array. The last numeral in the designation is the number of limited signals supplied to the combining part.

Clearly, any embodiment having an A-B or an A-B-C structure, A, B and C being integers, falls within the scope of the invention as claimed. For example, to obtain a folding signal with 16 transients, an embodiment according to the invention, which has a 4-4 structure can be used. In such an embodiment, the comparison part provides 16 comparison signals, and 4 groups of 4 comparison signals are combined to 4 intermediate folding signals. The latter 4 signals are successively limited and combined to obtain the folding signal.

Furthermore, embodiments having an A-B-C-D, A-B-C-D-E, etc. structure also fall within the scope of the invention as claimed. Having knowledge of the invention, those skilled in the art can readily conceive embodiments which comprise more than two limiter arrays. For example, an embodiment having a 3-3-3-3 structure provides a folding signal having 81 transients. In such an embodiment, three limiter arrays and three combiner arrays are present. Alternatively, a 9-9 structure could also be used to obtain a folding signal having 81 transients.

Functional parts, such as the comparison part CPM, the limiting part LIM, the combining part CBM, may be implemented in various ways. For example, the combiner C1, shown in FIG. 7a, could have been implemented in the same way as the combining part CBM, shown in FIG. 8, or vice versa. The comparison part CPM, and the limiters L1, L2 and L3 may be less straightforward than those shown in FIGS., 7a and 8, respectively. Furthermore, in any implementation, field effect—or MOS—transistors can be used. For example, the circuits shown in FIGS. 7a and 8 could equally well be implemented with MOS transistors instead of bipolar transistors. It will be understood by those skilled in the art, that the characteristics of the functional parts, as illustrated in FIGS. 2a–2c, 4a–4d and 6a–6f, matter, not the implementation of these parts.

In summary, the following has been disclosed in this specification. In a folding A/D converter, a comparison part provides a plurality of comparison signals in response to an input signal. The transients in the comparison signals are mutually shifted and substantially overlap. Because of the overlap, only a relatively small input signal variation is needed to pass all the transients. A limiting part effectively selects portions of the transients. A combining part effectively multiplexes these selected portions into a folding signal. The selection by the limiting part prevents distortion of the folding signal, despite the overlap.

We claim:

1. An A/D converter having at least one folding amplifier, the folding amplifier comprising:

comparison means for providing, in response to an input signal, a plurality of comparison signals having overlapping, mutually shifted transients;

limiting means for providing, in response to said plurality of comparison signals, a plurality of limited signals having substantially non-overlapping transients; and combining means for combining said plurality of limited signals to provide a folding signal.

2. An A/D converter as claimed in claim 1, wherein said limiting means comprises:

a plurality of combiners for combining respective groups of comparison signals having substantially non-overlapping mutually shifted transients to provide a plurality of intermediate folding signals having overlapping, mutually shifted transients; and a plurality of limiters having inputs coupled to receive said plurality of intermediate folding signals, and outputs coupled to said combining means.

3. An A/D converter as claimed in claim 2, wherein said limiting means further comprises:

a plurality of further combiners for combining respective groups of limited intermediate folding signals having substantially non-overlapping, mutually shifted transients to provide a plurality of further intermediate folding signals having overlapping, mutually shifted transients; and a plurality of further limiters having inputs coupled to receive said plurality of further intermediate folding signals, and outputs coupled to said combining means.

4. An A/D converter as claimed in claim 2, wherein each combiner has three inputs, each input being coupled to receive an intermediate folding signal.

5. An A/D converter as claimed in claim 3, wherein each further combiner has three inputs, each input being coupled to receive a further intermediate folding signal.

6. An A/D converter as claimed in claim 1, wherein said comparison means are arranged to provide a gain in the transients of said plurality of comparison signals.

7. A receiver comprising an A/D converter having at least one folding amplifier, the folding amplifier comprising:

comparison means for providing, in response to an input signal, a plurality of comparison signals having overlapping, mutually shifted transients;

limiting means for providing, in response to said plurality of comparison signals, a plurality of limited signals having substantially non-overlapping transients; and combining means for combining said plurality of limited signals to provide a folding signal.

8. A folding amplifier comprising:

comparison means for providing, in response to an input signal, a plurality of comparison signals having overlapping mutually shifted transients;

limiting means for providing, in response to said plurality of comparison signals, a plurality of limited signals having substantially non-overlapping transients; and combining means for combining said plurality of limited signals to provide a folding signal.

* * * * *